United States Patent
Maebashi et al.

(10) Patent No.: US 10,063,041 B2
(45) Date of Patent: Aug. 28, 2018

(54) ELECTRONIC COMPONENT UNIT

(71) Applicants: YAZAKI CORPORATION, Tokyo (JP); TOYOTA JIDOSHA KABUSHIKI KAISHA, Toyota-shi, Aichi-ken (JP)

(72) Inventors: Akemi Maebashi, Shizuoka (JP); Pharima Akanitsuk, Shizuoka (JP); Yusuke Noda, Toyota (JP); Hiroki Kawakami, Toyota (JP)

(73) Assignees: YAZAKI CORPORATION, Minato-ku, Tokyo (JP); TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 0 days.

(21) Appl. No.: 15/098,421

(22) Filed: Apr. 14, 2016

(65) Prior Publication Data
US 2016/0345455 A1 Nov. 24, 2016

(30) Foreign Application Priority Data
May 19, 2015 (JP) ................................. 2015-101590

(51) Int. Cl.
  *H05K 5/03* (2006.01)
  *H02G 3/08* (2006.01)
  (Continued)

(52) U.S. Cl.
  CPC ......... *H02G 3/088* (2013.01); *B60R 16/0238* (2013.01); *H05K 7/026* (2013.01)

(58) Field of Classification Search
None
See application file for complete search history.

(56) References Cited

U.S. PATENT DOCUMENTS 4,940,419 A 7/1990 Kurita et al.
4,952,753 A * 8/1990 Hayashi ............... B60R 16/027
                                                         174/535
(Continued)

FOREIGN PATENT DOCUMENTS

CN 1638223 A 7/2005
JP 1143231 U 10/1989
(Continued)

OTHER PUBLICATIONS

Communication dated May 16, 2017, from the Japanese Patent Office in counterpart application No. 2015-101590.
(Continued)

*Primary Examiner* — Dimary Lopez Cruz
(74) *Attorney, Agent, or Firm* — Sughrue Mion, PLLC

(57) ABSTRACT

An electronic component unit includes a housing that accommodates electronic components therein and that is provided with connecting units connected to electric wires on a vertical-direction lower surface. The housing has protruding ribs protruding downward in a vertical direction from the vertical-direction lower surface, positioned between the connecting units and respective side wall surfaces of the housing provided to sides of the vertical-direction lower surface, and extending from one end to the other end of the vertical-direction lower surface along the side wall surfaces. The electronic component unit having this configuration can prevent adhesion of water to the connecting units.

5 Claims, 5 Drawing Sheets

(51) Int. Cl.
*B60R 16/023* (2006.01)
*H05K 7/02* (2006.01)

(56) References Cited

U.S. PATENT DOCUMENTS

| | | | | | |
|---|---|---|---|---|---|
| 6,982,379 | B2* | 1/2006 | Saka | ............... | H05K 7/026 |
| | | | | | 174/135 |
| 7,025,624 | B2* | 4/2006 | Kiyota | ............ | H01R 13/641 |
| | | | | | 439/489 |
| 7,253,356 | B2* | 8/2007 | Kiyota | ............ | H02G 3/081 |
| | | | | | 174/17 R |
| 8,157,116 | B2* | 4/2012 | Ejima | ............ | B60R 16/0238 |
| | | | | | 174/58 |
| 8,941,009 | B2* | 1/2015 | Makino | ............ | B60R 16/02 |
| | | | | | 174/50 |
| 2005/0178576 | A1 | 8/2005 | Saka et al. | | |
| 2005/0194167 | A1 | 9/2005 | Kiyota et al. | | |
| 2013/0250489 | A1 | 9/2013 | Toda et al. | | |

FOREIGN PATENT DOCUMENTS

| | | |
|---|---|---|
| JP | 2005229740 A | 8/2005 |
| JP | 2011193594 A | 9/2011 |
| JP | 2013-198347 A | 9/2013 |

OTHER PUBLICATIONS

Communication dated Jul. 25, 2017, from the Japanese Patent Office in counterpart application No. 2015-101590.
Communication dated Jun. 2, 2017, from State Intellectual Property of the P.R.C. in counterpart application No. 201610245127.9.
Communication dated Dec. 4, 2017 issued by the State Intellectual Property Office of the People's Republic of China in counterpart Chinese application No. 201610245127.9.
Communication dated Dec. 14, 2017 issued by the State Intellectual Property Office of the People's Republic of China in counterpart Chinese application No. 201610245127.9.
The Third Office Action dated Jun. 19, 2018, in corresponding CN Application No. 201610245127.9, 8 pages in English and Chinese.

* cited by examiner

ELECTRONIC COMPONENT UNIT

CROSS-REFERENCE TO RELATED APPLICATION(S)

The present application claims priority to and incorporates by reference the entire contents of Japanese Patent Application No. 2015-101590 filed in Japan on May 19, 2015.

BACKGROUND OF THE INVENTION

1. Field of the Invention

The present invention relates to an electronic component unit.

2. Description of the Related Art

There have conventionally been developed various types of electronic component units mounted on vehicles and other objects, including an electronic component module disclosed in Japanese Patent Application Laid-open No. 2013-198347, for example. The electronic component module includes an electronic component substrate and a case. The electronic component substrate includes an insulating panel provided with a plurality of bus bars to which a plurality of electronic components are electrically connected. The case accommodates therein the electronic component substrate. The electronic component module has a connector-connecting portion in which a plurality of external terminal-connecting portions of the respective bus bars are collected. In the electronic component module, the connector-connecting portion is arranged between the electronic components, thereby downsizing the unit.

The electronic component module described in Japanese Patent Application Laid-open No. 2013-198347, for example, is expected to prevent water adhering to the case (housing) from adhering to the connector (connecting unit) exposed outside the case.

SUMMARY OF THE INVENTION

In view of the circumstances described above, the present invention aims to provide an electronic component unit that can prevent adhesion of water to a connecting unit.

In order to achieve the above mentioned object, an electronic component unit according to one aspect of the present invention includes a housing configured to accommodate an electronic component therein and provided with a connecting unit connected to an electric wire on a vertical-direction lower surface, wherein the housing has a protruding rib protruding downward in a vertical direction from the vertical-direction lower surface, positioned between the connecting unit and a side wall surface of the housing provided to a side of the vertical-direction lower surface, and extending from a first end to a second end of the vertical-direction lower surface along the side wall surface.

According to another aspect of the present invention, in the electronic component unit, the housing may have an inclined surface on the vertical-direction lower surface, the inclined surface inclining such that an end on the side wall surface side is positioned lower in the vertical direction and that an end on the connecting unit side is positioned upper in the vertical direction in a state where the housing is placed at an installation position, and the protruding rib may be provided to the inclined surface and extends in a direction intersecting with an inclination direction of the inclined surface.

According to still another aspect of the present invention, in the electronic component unit, the housing may have a draining step portion positioned adjacent to the connecting unit side at both ends of the protruding rib on the vertical-direction lower surface and recessed upward in the vertical direction with respect to a vertical-direction lower end of the protruding rib.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments according to the present invention are described below in greater detail with reference to the accompanying drawings. The embodiments are not intended to limit the invention. Components according to the embodiments below include components easily interchangeable by those skilled in the art or components substantially identical thereto.

EMBODIMENT

Figure 1:
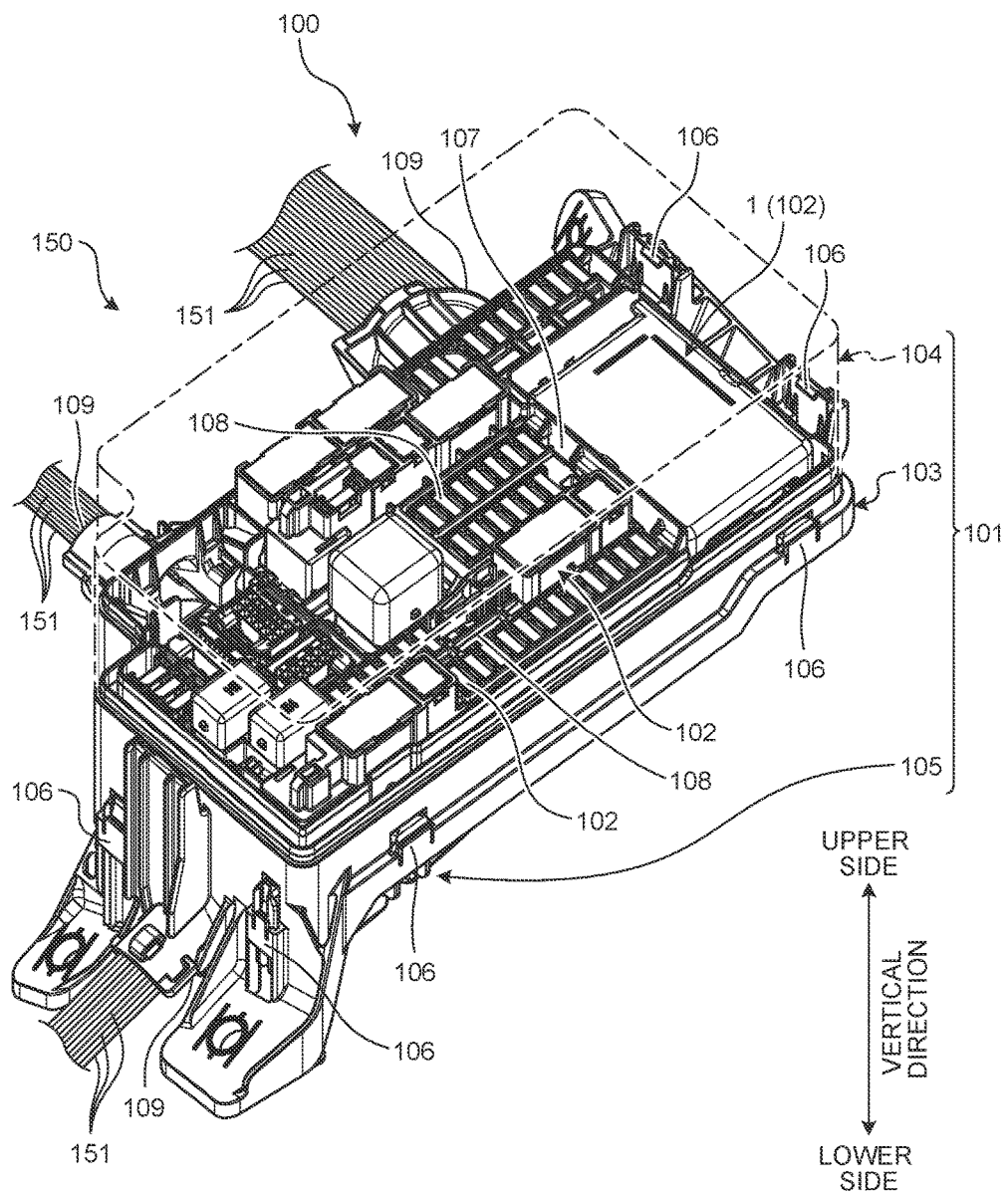
FIG. 1 is a perspective view of a schematic configuration of an electrical connection box to which an electronic component unit according to an embodiment of the present invention is applied.
Figure 2:
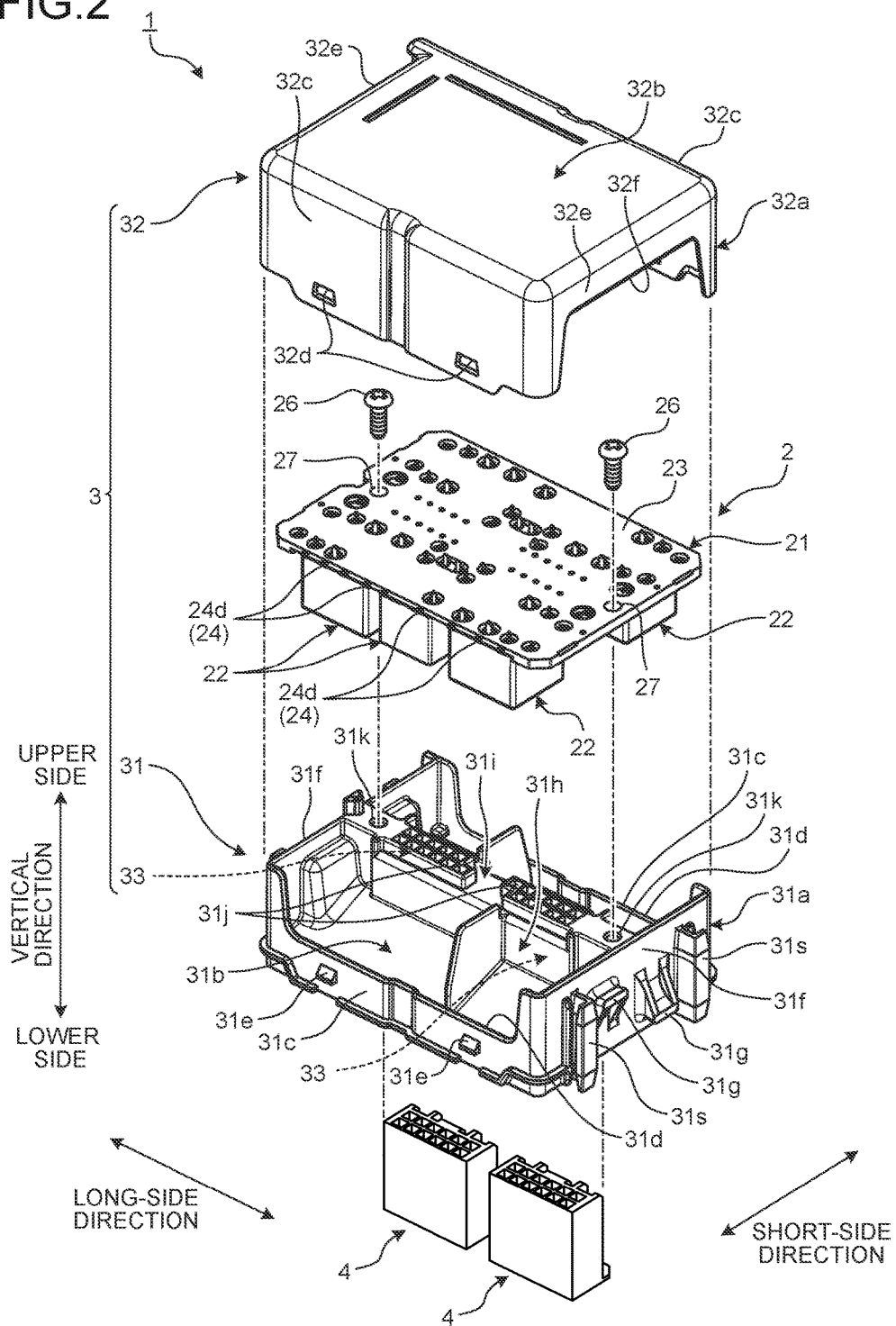
FIG. 2 is an exploded perspective view of a schematic configuration of the electronic component unit according to the embodiment.
Figure 3:
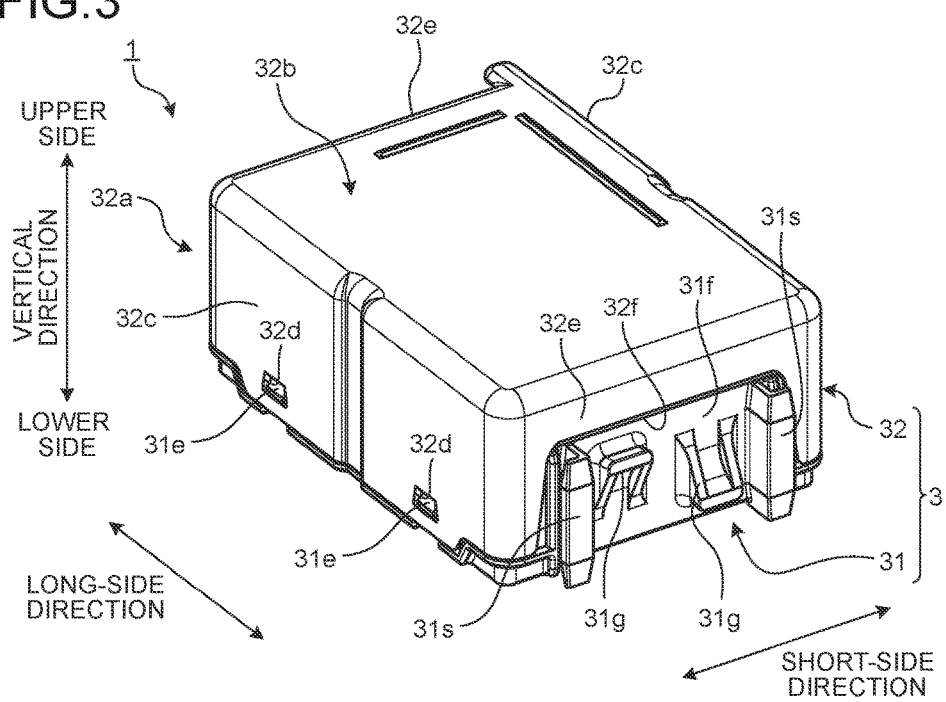
FIG. 3 is a perspective view of a schematic configuration of the electronic component unit according to the embodiment.
Figure 4:
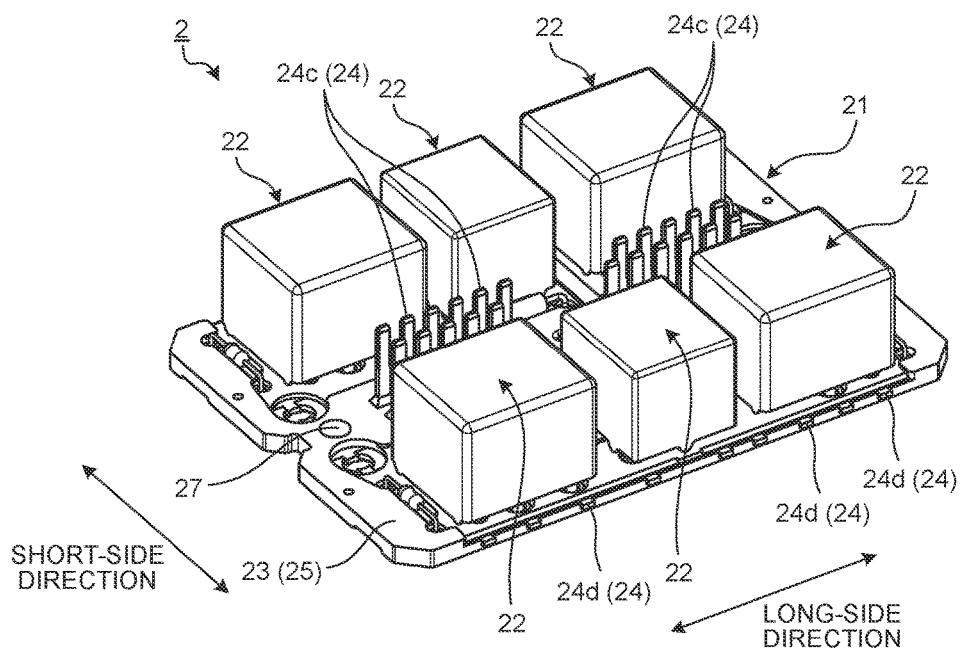
FIG. 4 is a perspective view of a schematic configuration of an insert bus bar plate of the electronic component unit according to the embodiment.
Figure 5:
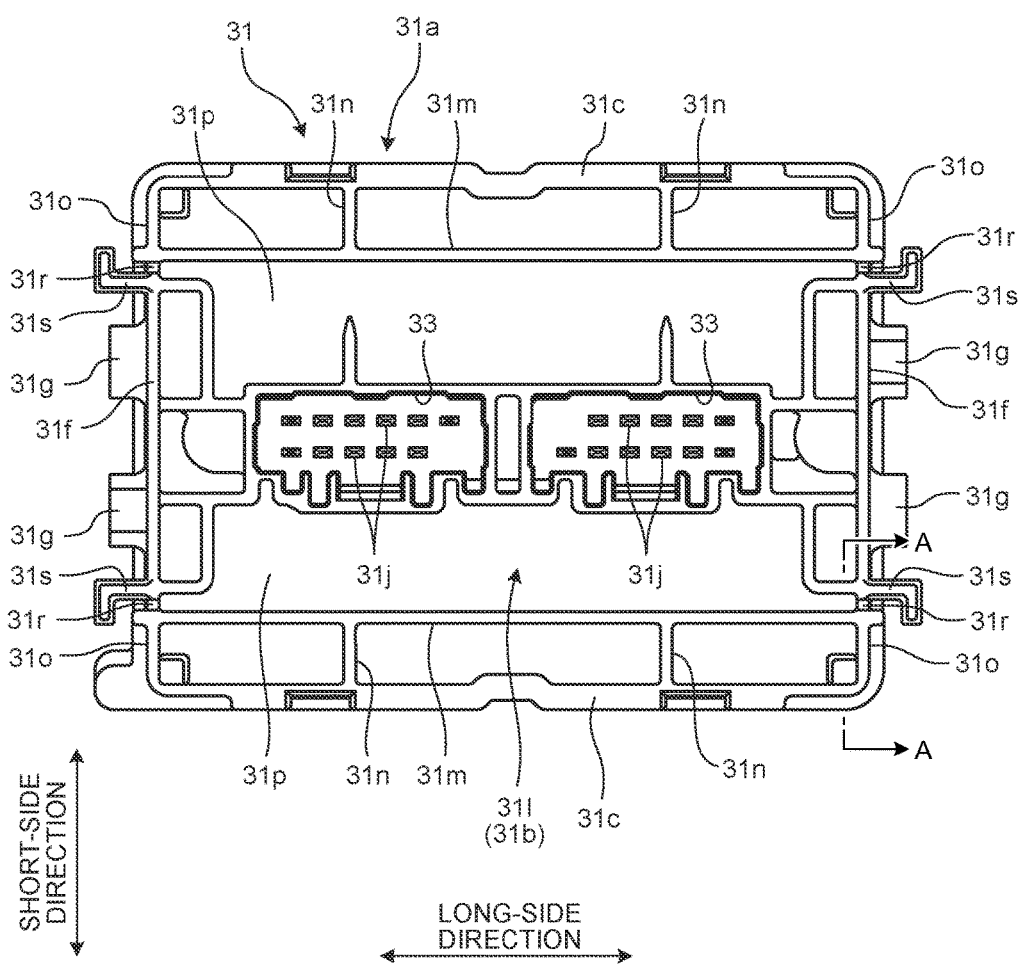
FIG. 5 is a plan view of a base cover of the electronic component unit according to the embodiment viewed from a connector fitting portion side.
Figure 6:
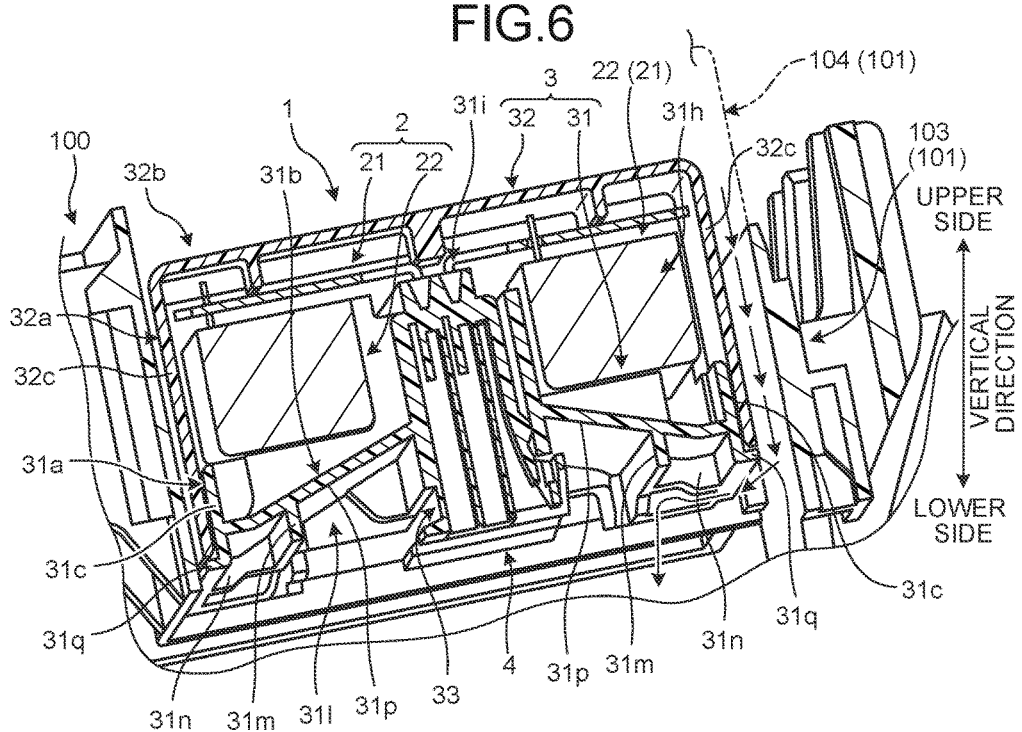
FIG. 6 is a partial sectional view including the electronic component unit according to the embodiment.
Figure 7:
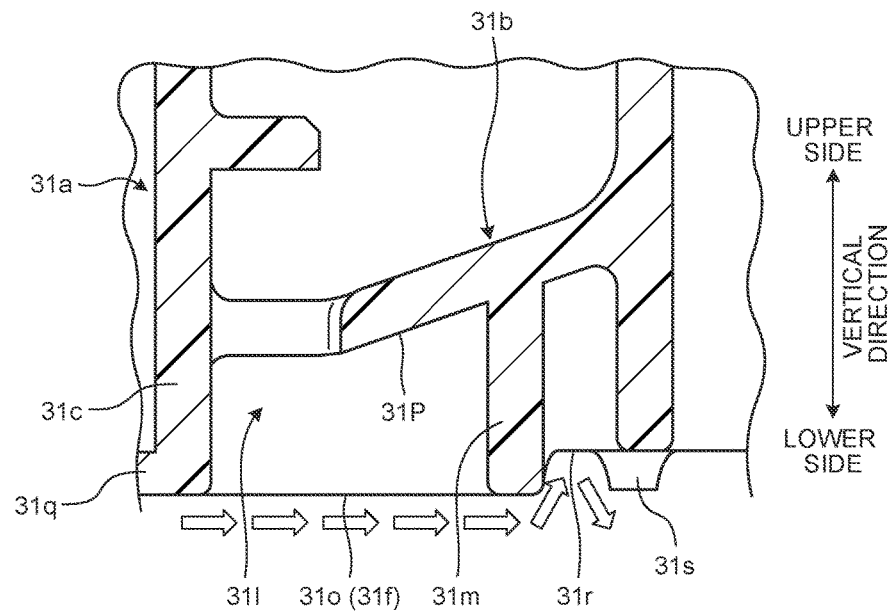
FIG. 7 is a partial sectional view along A-A in FIG. 5.

FIG. 1 is a perspective view of a schematic configuration of an electrical connection box to which an electronic component unit according to an embodiment of the present invention is applied. FIG. 2 is an exploded perspective view of a schematic configuration of the electronic component unit according to the embodiment. FIG. 3 is a perspective view of a schematic configuration of the electronic component unit according to the embodiment. FIG. 4 is a perspective view of a schematic configuration of an insert bus bar plate of the electronic component unit according to the embodiment. FIG. 5 is a plan view of a base cover of the electronic component unit according to the embodiment viewed from a connector fitting portion side. FIG. 6 is a partial sectional view including the electronic component unit according to the embodiment. FIG. 7 is a partial sectional view along A-A in FIG. 5. In FIG. 1, the alternate long and two short dashes line indicates an upper cover of the electrical connection box.

As illustrated in FIG. 1, an electronic component unit 1 according to the present embodiment serves as an electronic component module detachably attached to an electrical connection box 100 mounted on a vehicle, such as an automobile. The electrical connection box 100 is included in a wire harness 150 and collectively accommodates electric components, such as connectors serving as coupling parts such as electric wires, fuses, relays, branch connections, and electronic control units. The wire harness 150 includes electric wires 151 and the electrical connection box 100 (electronic component unit 1) electrically connected to the electric wires 151. The electrical connection box 100, for example, is placed in an engine compartment of a vehicle or a lower portion of a vehicle body and connected between a power source, such as a battery, and various electronic devices mounted on the vehicle. The electrical connection box 100 distributes electric power supplied from the power source to the various electronic devices in the vehicle. While the electrical connection box 100 may possibly be called a junction box, a fuse box, or a relay box, for example, they are correctively called an electrical connection box in the present embodiment.

The electrical connection box 100 illustrated in FIG. 1 accommodates various electronic components 102 in an internal accommodation space of a box main body 101. The box main body 101 includes a body 103, an upper cover 104, and a lower cover 105, for example. The box main body 101 has a three-layer divided structure composed of the body 103, the upper cover 104, and the lower cover 105. The body 103, the upper cover 104, and the lower cover 105 are made of an insulating synthetic resin. The body 103 is a main member forming the accommodation space to which the electronic components 102 are attached. The body 103 has a substantially square tubular shape and has openings on the upper side and the lower side in the vertical direction in a state where the electrical connection box 100 is connected to the engine compartment or other components. The upper cover 104 is a lid-shaped member that covers the opening on the upper side in the vertical direction of the body 103. The lower cover 105 is a dish-shaped (tray-shaped) member that covers the opening on the lower side in the vertical direction of the body 103. The upper cover 104 of the box main body 101 is attached to the upper portion in the vertical direction of the body 103 with the opening on the upper side in the vertical direction of the body 103 facing an opening of the upper cover 104. The lower cover 105 is attached to the lower portion in the vertical direction of the body 103 with the opening on the lower side in the vertical direction of the body 103 facing an opening of the lower cover 105. The upper cover 104 and the lower cover 105 of the box main body 101 are locked to the body 103 with locking mechanisms 106 having various forms. The direction in which the body 103, the upper cover 104, and the lower cover 105 are stacked typically corresponds to the vertical direction in a state where the electrical connection box 100 is connected to the engine compartment or other components. The stacking direction, however, may possibly be inclined at a predetermined angle with respect to the vertical direction depending on the installation state of the electrical connection box 100.

Examples of the various electronic components 102 attached to the internal accommodation space of the box main body 101 include the electronic component unit 1 according to the present embodiment besides connectors, fuses, relays, branch connections, electronic control units, and other parts, as described above. In the electrical connection box 100, a number of cavities are formed by partition walls 107 having various shapes, blocks 108 having various shapes, and other parts. The partition walls 107 are formed integrally with the body 103, and the blocks 108 are detachably attached to the body 103. The various electronic components 102 are attached to the inside of the cavities. In this case, the partition walls 107, the blocks 108, and other parts are made of an insulating synthetic resin similarly to the body 103 and other parts. In the electrical connection box 100, terminals of the electric wires 151 extending through openings 109, for example, are fit to the cavities installed with the various electronic components 102 from the lower side in the vertical direction. The wires 151 are thus electrically connected to the electrical connection box 100.

As illustrated in FIGS. 2 to 4, the electronic component unit 1 according to the present embodiment includes an insert bus bar plate 2 serving as a plate, a housing 3, and connectors 4 serving as connecting units connected to the electric wires 151. The insert bus bar plate 2 is attached to the inside of the housing 3.

As illustrated in FIGS. 2 and 4, the insert bus bar plate 2 is a substrate including metal bus bars 24 inside a resin member 23 and on which electronic components 22 are mounted. The insert bus bar plate 2 includes a substrate main body 21 and the electronic components 22.

The substrate main body 21 includes a plurality of conductive bus bars 24 inside the resin member 23. In other words, the bus bars 24 are covered with the insulating resin member 23 to be electrically insulated from one another. The substrate main body 21, for example, is manufactured by insert molding by: arranging the bus bars 24 made of a conductive metal in a mold, and injecting an insulating resin around the bus bars 24 to integrate the metal with the resin. The bus bars 24 are subjected to insert molding in a state being connected to one another with a carrier, for example. After the insert molding is performed, the carrier is cut off. The substrate main body 21 has a rectangular plate shape as a whole.

The substrate main body 21 is obtained by performing insert molding on the bus bars 24. As illustrated in FIG. 4 and other figures, terminals 24c of the respective bus bars 24 are arranged nearly at the center in a short-side direction (first width direction) of the substrate main body 21 side by side along a long-side direction (second width direction orthogonal to the first width direction). The terminals 24c are aligned in two lines along the long-side direction. Each terminal 24c is provided in a manner standing nearly vertically to a mounting surface 25 of the substrate main body 21 on which the electronic components 22 are mounted. In other words, each terminal 24c protrudes and extends from the mounting surface 25 in a direction orthogonal to the short-side direction and the long-side direction. Each terminal 24c is positioned between the electronic components 22, which will be described later, in the short-side direction. In other words, the terminals 24c are collected at the center of the mounting surface 25. In the substrate main body 21, an end of each bus bar 24 connected to the carrier cut off after the insert molding serves as an exposed end 24d exposed from the resin member 23 at end surfaces of the substrate main body 21. In other words, the insert bus bar plate 2 includes a plurality of exposed ends 24d of the bus bars 24 exposed at the end surfaces thereof. The exposed ends 24d are provided to a pair of facing long-side end surfaces in the substrate main body 21. The long-side end surfaces each have a plurality of exposed ends 24d arranged side by side along the long-side direction.

The electronic components 22 are elements mounted on the mounting surface 25 of the substrate main body 21 to perform various functions. Each terminal of the electronic components 22 is electrically connected to a predetermined bus bar 24 and is fixed to the back surface of the mounting surface 25 with solder or others. The electronic components 22 according to the present embodiment are relays, for example. In other words, the electronic component unit 1 according to the present embodiment is a relay unit module. The insert bus bar plate 2 according to the present embodiment is provided with three relays corresponding to the electronic components 22 aligned along the long-side direction on each of both sides of the terminals 24c in the short-side direction, that is, six relays in total. In the insert bus bar plate 2, the electronic components 22 are arranged in two lines, and the terminals 24c are arranged in two lines between the double-lined electronic components 22. The insert bus bar plate 2 according to the present embodiment basically has a substantially line-symmetric shape with respect to the center line of the substrate main body 21 along the long-side direction (that is, the center line in the short-side direction). The terminals 24c and the electronic components 22 are also arranged in a substantially line-symmetric manner. The insert bus bar plate 2 is also provided with elements, such as relay resistances, besides the six relays corresponding to the electronic components 22.

As illustrated in FIGS. 2 and 3, the housing 3 holds the insert bus bar plate 2 attached thereto. The housing 3 according to the present embodiment includes a base cover 31 serving as a base portion, a top cover 32 serving as a lid, and connector fitting portions 33 serving as connecting unit fitting portions. The insert bus bar plate 2 is attached to the inner space partitioned by the base cover 31 and the top cover 32. The insert bus bar plate 2 is attached to the base cover 31. The top cover 32 covers the insert bus bar plate 2 attached to the base cover 31 from the side opposite to the base cover 31. The connectors 4 serve as the connecting units between the terminals 24c of the bus bars 24 and the electric wires 151 and are fit into the connector fitting portions 33. The connector fitting portions 33 are formed integrally with the base cover 31. The base cover 31, the top cover 32, and the connector fitting portions 33 are made of an insulating synthetic resin.

Specifically, the base cover 31 is a dish-shaped (tray-shaped) member as illustrated in FIG. 2. The base cover 31 has a rectangular frame 31a and a bottom portion 31b. The rectangular frame 31a is a wall body having a substantially square shape. The bottom portion 31b closes the rectangular frame 31a. The bottom portion 31b has a rectangular plate shape similar to that of the substrate main body 21 of the insert bus bar plate 2. The rectangular frame 31a is formed in a manner surrounding the periphery of the bottom portion 31b. The bottom portion 31b is formed integrally with the rectangular frame 31a at an intermediate portion of the rectangular frame 31a (refer to FIG. 6 and other figures). The rectangular frame 31a has cut-outs 31d and engaging claws 31e formed on a pair of long-side wall surfaces 31c extending in the long-side direction of the bottom portion 31b. The engaging claws 31e engage with the top cover 32. The rectangular frame 31a also has locking claws 31g formed on a pair of short-side wall surfaces 31f extending in the short-side direction of the bottom portion 31b. The locking claws 31g serve as holding members that engage with the box main body 101 of the electrical connection box 100. The base cover 31 has a rectangular tubular shape (a part of which is cut off by the cut-outs 31d) closed with the bottom portion 31b at the intermediate portion of the rectangular frame 31a. The space surrounded by the rectangular frame 31a and the bottom portion 31b in the base cover 31 is partitioned as an accommodation space 31h that accommodates the electronic components 22 on the insert bus bar plate 2.

The base cover 31 has a center wall 31i at the center of the bottom portion 31b. The center wall 31i is formed by the bottom portion 31b protruding toward the accommodation space 31h side. The center wall 31i is formed nearly at the center in the short-side direction of the bottom portion 31b in a manner extending along the long-side direction. The center wall 31i extends along the long-side direction from a first short-side wall face 31f to a second short-side wall face 31f. The center wall 31i has a plurality of terminal fitting holes 31j (also refer to FIG. 5) and a pair of screw holes 31k on the top surface thereof. When the insert bus bar plate 2 is attached to the base cover 31, the terminals 24c of the respective bus bars 24 fit into the terminal fitting holes 31j. The number and the positions of the terminal fitting holes 31j correspond to those of the terminals 24c. The terminal fitting holes 31j are arranged in two lines along the long-side direction. When the insert bus bar plate 2 is attached to the base cover 31, screws 26 are screwed into the screw holes 31k to fix the insert bus bar plate 2 to the base cover 31.

The base cover 31 has a hollow space on the back surface side of the center wall 31i, that is, the side opposite to the accommodation space 31h. The hollow space serves as the connector fitting portions 33 into which the connectors 4 serving as the connecting units connected to the electric wires 151 fit (also refer to FIGS. 5 and 6 and other figures). The terminals 24c of the respective bus bars 24 are exposed in the connector fitting portions 33 through the respective terminal fitting holes 31j in a state in which the insert bus bar plate 2 is attached to the base cover 31. The connector fitting portions 33 are formed at two positions, and two connectors 4 fit into the respective two connector fitting portions 33. Thus, in the electronic component unit 1 according to the present embodiment, the two connectors 4 are connected to the terminals 24c of the bus bars 24.

As illustrated in FIGS. 2 and 3, the top cover 32 is a lid-shaped member. The top cover 32 has a rectangular frame 32a and a roof portion 32b. The rectangular frame 32a is a wall body having a substantially square shape. The roof portion 32b closes one of the openings of the rectangular frame 32a. The roof portion 32b has a rectangular plate shape similar to those of the substrate main body 21 of the insert bus bar plate 2 and of the bottom portion 31b of the base cover 31. The rectangular frame 32a is formed in a manner standing at the periphery of the roof portion 32b. The rectangular frame 32a has engaging recesses 32d formed on a pair of long-side wall surfaces 32c extending in the long-side direction of the roof portion 32b. The engaging recesses 32d engage with the base cover 31. The rectangular frame 32a has cut-outs 32f formed on a pair of short-side wall surfaces 32e extending in the short-side direction of the roof portion 32b. The top cover 32 has a rectangular tubular shape (a part of which is cut off by the cut-outs 32f) in which one end of the rectangular frame 32a is opened and the other end thereof is closed with the roof portion 32b.

As illustrated in FIGS. 2 and 3, the electronic component unit 1 having the configuration above is provided as one module by: attaching the insert bus bar plate 2 to the base cover 31, covering the upper side of the insert bus bar plate 2 opposite to the base cover 31 side with the top cover 32, and fitting the connectors 4 into the connector fitting portions 33.

More specifically, in the electronic component unit 1, the insert bus bar plate 2 is attached to the base cover 31 such that the electronic components 22 on the insert bus bar plate 2 are accommodated in the accommodation space 31h of the base cover 31, that is, such that the mounting surface 25 (refer to FIG. 4 and other figures) on which the electronic components 22 are mounted faces the bottom portion 31b of the base cover 31. When the insert bus bar plate 2 is attached to the base cover 31 in the electronic component unit 1, the terminals 24c of the bus bars 24 on the insert bus bar plate 2 fit into the respective terminal fitting holes 31j of the base cover 31. The terminals 24c are exposed in the connector fitting portions 33 along the direction orthogonal to the short-side direction and the long-side direction. In the electronic component unit 1, the screws 26 are inserted into screw holes 27 of the insert bus bar plate 2 to be screwed into the screw holes 31k of the base cover 31. The insert bus bar plate 2 is thus fixed to the base cover 31. When the insert bus bar plate 2 is attached to the base cover 31, the electronic component unit 1 has three electronic components 22 on each of both sides of the center wall 31i in the short-side direction.

In the electronic component unit 1, the top cover 32 is attached to the base cover 31 and other components such that the top cover 32 covers, from the side opposite to the base cover 31 side, the insert bus bar plate 2 attached to the base cover 31. In the electronic component unit 1, the engaging claws 31e of the base cover 31 engage with the respective engaging recesses 32d of the top cover 32 with the top cover 32 attached to the correct position. The top cover 32 is thus attached to the base cover 31. When the top cover 32 is attached to the base cover 31 in the electronic component unit 1, the rectangular frame 32a of the top cover 32 overlaps with the outer surface of the rectangular frame 31a of the base cover 31 as illustrated in FIG. 3 and other figures. In addition, the locking claws 31g are exposed from the cutouts 32f of the top cover 32. In the electronic component unit 1, the connectors 4 are fitted into the connector fitting portions 33 along the direction orthogonal to the short-side direction and the long-side direction. Thus, the connectors 4 are connected to the terminals 24c of the bus bars 24, and the electronic component unit 1 is attached to a predetermined position in the box main body 101 of the electrical connection box 100 with the locking claws 31g.

Similarly to the electrical connection box 100 described above, the direction in which the base cover 31, the insert bus bar plate 2, and the top cover 32 are stacked corresponds to the vertical direction with the electrical connection box 100 connected to the engine compartment or other components. The stacking direction, however, may possibly be inclined at a predetermined angle with respect to the vertical direction depending on the installation state of the electrical connection box 100.

The electrical connection box 100 according to the present embodiment has a double wall at the connecting portions between the body 103, the upper cover 104, and the lower cover 105. With the double wall and other factors, the electrical connection box 100 basically has a waterproof structure for preventing water from entering into the box main body 101. The electronic component unit 1 according to the present embodiment employs a configuration on the assumption that water may possibly enter into the box main body 101 despite the waterproof structure.

Specifically, as illustrated in FIGS. 2, 5, and 6, the housing 3 of the electronic component unit 1 according to the present embodiment accommodates therein the electronic components 22 and is provided with the connectors 4 serving as the connecting units connected to the electric wires 151 on a vertical-direction lower surface 311. The vertical-direction lower surface 311 of the housing 3 is a back surface of the bottom portion 31b of the base cover 31, that is, a surface on the side opposite to the accommodation space 31h of the bottom portion 31b. The following describes the positional relation in a state where the housing 3 is placed at a predetermined installation position in the vehicle unless otherwise specified.

The housing 3 according to the present embodiment has protruding ribs 31m on the vertical-direction lower surface 311. The protruding ribs 31m protrude downward in the vertical direction from the vertical-direction lower surface 311 of the bottom portion 31b of the base cover 31. The protruding ribs 31m are positioned between a side wall of the housing 3 provided to the side extending in the long-side direction of the vertical-direction lower surface 311, that is, the long-side wall surface 31c, and the connectors 4. The protruding ribs 31m extend from one end to the other end of the vertical-direction lower surface 311 along the long-side wall surface 31c. One protruding rib 31m is provided to a space between each of a pair of long-side wall surfaces 31c and the connectors 4, that is, two protruding ribs 31m are provided in total. In other words, a first protruding rib 31m is provided between the connector fitting portions 33 into which the connectors 4 fit and one of the long-side wall surfaces 31c in the short-side direction, and a second protruding rib 31m is provided between the connector fitting portions 33 and the other of the long-side wall surfaces 31c. The protruding ribs 31m extend from one end to the other end of the vertical-direction lower surface 311 along the long-side wall surface 31c. Both ends of the protruding ribs 31m are connected to the side wall surfaces of the housing 3 provided to the sides extending in the short-side direction of the vertical-direction lower surface 311, that is, to the short-side wall surfaces 31f. The protruding ribs 31m are also connected to the respective long-side wall surfaces 31c with reinforcing ribs 31n extending along the short-side direction and vertical-direction lower ends 31o of the short-side wall surfaces 31f, for example. In other words, the reinforcing ribs 31n and a part of the vertical-direction lower ends 31o of the short-side wall surfaces 31f are provided between the protruding ribs 31m and the respective long-side wall surfaces 31c. The portions between the long-side wall surfaces 31c and the respective protruding ribs 31m in the long-side wall surfaces 31c, the protruding ribs 31m, the reinforcing ribs 31n, and the vertical-direction lower ends 31o of the short-side wall surfaces 31f are substantially uniform in level on the vertical-direction lower end surfaces.

The housing 3 has inclined surfaces 31p on the vertical-direction lower surface 311. The protruding ribs 31m are provided to the inclined surfaces 31p and extend in a direction intersecting with the inclination direction of the inclined surfaces 31p, typically, in a direction orthogonal thereto. The inclined surfaces 31p incline such that the end on the long-side wall surface 31c side is positioned lower in the vertical direction and that the end on the connector 4 side is positioned upper in the vertical direction when the housing 3 is placed at the installation position. The inclined surfaces 31p according to the present embodiment are provided in pair on both sides of the connector fitting portions 33 on the vertical-direction lower surface 311. More specifically, each of the inclined surfaces 31p extends from the long-side wall surface 31c of the base cover 31 to the connector fitting portions 33. Each of the inclined surfaces 31p inclines upward in the vertical direction from the long-side wall surface 31c to the connector fitting portions 33. Thus, in the housing 3 according to the present embodiment, the bottom portion 31b including the vertical-direction lower surface 311 has a substantially chevronshaped section inclining downward as it extends away from the connector fitting portions 33 in a sectional view along the short-side direction (refer to FIG. 6 and other figures). Each of the inclined surfaces 31*p* is positioned uppermost on the connector fitting portion 33 side and lowermost on the long-side wall surface 31*c* side. The protruding ribs 31*m* are provided to an intermediate portion of the respective inclined surfaces 31*p* along the long-side direction.

The electronic component unit 1 according to the present embodiment is placed in a manner inclined at a predetermined angle with respect to the short-side direction (refer to FIG. 6 and other figures). The electronic component unit 1 is placed in a manner inclined such that a first long-side wall surface 31*c* of the base cover 31 is positioned lower in the vertical direction and that a second long-side wall surface 31*c* is positioned upper in the vertical direction. In addition, the electronic component unit 1 is placed such that the second long-side wall surface 31*c* positioned upper in the vertical direction is positioned on the outer side (on the side near the wall of the body 103) in the box main body 101. The electronic component unit 1 according to the present embodiment has the inclined surface 31*p* inclining upward in the vertical direction from the long-side wall surfaces 31*c* and 32*c* side positioned at least upper in the vertical direction and on the outer side in the box main body 101 (on the side near the wall of the body 103) toward the connector fitting portions 33 side. Each of the inclined surfaces 31*p* inclines at an inclination angle at which the end on the long-side wall surfaces 31*c* and 32*c* side is positioned lower in the vertical direction and the end on the connector 4 side is positioned upper in the vertical direction.

As illustrated in FIGS. 6 and 7 and other figures, the housing 3 according to the present embodiment has a draining portion 31*q*. The draining portion 31*q* is a portion of the long-side wall surfaces 31*c* of the base cover 31 protruding downward in the vertical direction from the vertical-direction lower surface 31*l*. The draining portion 31*q* has a substantially square shape surrounding nearly the entire periphery of the vertical-direction lower end of the rectangular frame 31*a* of the base cover 31. In the present embodiment, a part of the vertical-direction lower end bends outward. The electronic component unit 1 thus has the draining portion 31*q* at the lower ends of the long-side wall surfaces 31*c*. Because the draining portion 31*q* drains water adhering to the long-side wall surfaces 31*c* and 32*c* and other parts, the electronic component unit 1 can prevent the adhering water from moving toward the vertical-direction lower surface 31*l* side.

The housing 3 according to the present embodiment also has draining step portions 31*r* at both end sides of the protruding ribs 31*m*. The draining step portions 31*r* are positioned adjacent to the connectors 4 side at both ends of each of the protruding ribs 31*m* on the vertical-direction lower surface 31*l*. The draining step portions 31*r* are recessed upward in the vertical direction with respect to the vertical-direction lower end of the protruding rib 31*m*. In other words, the draining step portions 31*r* are recessed with respect to the vertical-direction lower end of the protruding rib 31*m* on the side near the connector fitting portion 33 (that is, the side near the center in the short-side direction) at both ends of the protruding rib 31*m*, that is, the connecting portions between the protruding rib 31*m* and the vertical-direction lower ends 31*o* of the short-side wall surfaces 31*f*. More specifically, the draining step portions 31*r* are recesses (difference in level) recessed upward in the vertical direction at the vertical-direction lower ends 31*o* of the short-side wall surfaces 31*f* to which both ends of the protruding rib 31*m* are connected. The draining step portions 31*r* are recessed upward with respect to the portion between the long-side wall surface 31*c* and the protruding rib 31*m* in the protruding rib 31*m*, the reinforcing ribs 31*n*, and the vertical-direction lower ends 31*o* of the short-side wall surfaces 31*f* the vertical-direction lower end surfaces of which are substantially uniform in level.

The base cover 31 of the housing 3 has guide members 31*s* (refer to FIGS. 2, 3, 5, and 7, and other figures) formed, on the short-side wall surfaces 31*f*, at positions separated from each of the protruding ribs 31*m* on the side closer to the draining step portions 31*r* in the short-side direction. The guide members 31*s* are provided in pair on the sides closer to both ends in the short-side direction than the two locking claws 31*g* on each of the short-side wall surfaces 31*f*. The guide members 31*s* extend in the direction orthogonal to the short-side direction and the long-side direction. When the electronic component unit 1 is fitted into the predetermined position in the box main body 101, the guide members 31*s* fit into guide receiving portions provided on the box main body 101 and guided. The base cover 31 of the housing 3 according to the present embodiment has the draining step portions 31*r* at least between the guide members 31*s* and the respective protruding ribs 31*m* at the vertical-direction lower ends 31*o* of the short-side wall surfaces 31*f*.

As described above, the electronic component unit 1 includes the housing 3 that accommodates therein the electronic components 22 and that is provided with the connectors 4 serving as the connecting units connected to the electric wires 151 on the vertical-direction lower surface 31*l*. The housing 3 has the protruding ribs 31*m* protruding downward in the vertical direction from the vertical-direction lower surface 31*l*, positioned between the connectors 4 and the respective long-side wall surfaces 31*c* of the housing 3 provided to the sides of the vertical-direction lower surface 31*l*, and extending from one end to the other end of the vertical-direction lower surface 31*l* along the long-side wall surfaces 31*c*.

As described above, the electronic component unit 1 has the protruding ribs 31*m* positioned between the respective long-side wall surfaces 31*c* of the housing 3 and the connectors 4 on the vertical-direction lower surface 31*l* of the housing 3 and extending from one end to the other end of the vertical-direction lower surface 31*l* along the long-side wall surfaces 31*c*. The protruding ribs 31*m* can prevent water adhered to the long-side wall surfaces 31*c* and 32*c* and other parts from moving toward the connectors 4 side along the vertical-direction lower surface 31*l* via the reinforcing ribs 31*n* and the portions between the long-side wall surfaces 31*c* and the protruding ribs 31*m* at the vertical-direction lower ends 31*o* of the short-side wall surfaces 31*f*, for example. Thus, even if water enters into the box main body 101 as indicated by the arrows in FIG. 6, for example, the electronic component unit 1 can prevent adhesion of the water to the connectors 4.

The housing 3 of the electronic component unit 1 described above has, on the vertical-direction lower surface 31*l*, the inclined surfaces 31*p* inclining such that the end on the long-side wall surface 31*c* side is positioned lower in the vertical direction and that the end on the connector 4 side is positioned upper in the vertical direction when the housing 3 is placed at the installation position. The protruding ribs 31*m* are provided to the respective inclined surfaces 31*p* and extend in a direction intersecting with the inclination direction of the inclined surfaces 31*p*. With the inclined surfaces 31*p*, the electronic component unit 1 can prevent water adhered to the long-side wall surfaces 31*c* and 32*c* and other parts from moving toward the connectors 4 along the vertical-direction lower surface 311. In addition, the protruding ribs 31*m* can prevent the water from moving toward the connectors 4. The electronic component unit 1 can thus more reliably prevent adhesion of water to the connectors 4.

The housing 3 of the electronic component unit 1 described above has the draining step portions 31*r* positioned adjacent to the connectors 4 at both ends of each of the protruding ribs 31*m* on the vertical-direction lower surface 311 and recessed upward in the vertical direction with respect to the vertical-direction lower end of the protruding rib 31*m*. With this configuration, even if water adhered to the long-side wall surfaces 31*c* and 32*c* and other parts moves toward the connectors 4 along the ends of the vertical-direction lower surface 311 (e.g., the vertical-direction lower ends 31*o* of the short-side wall surfaces 31*f*), in the electronic component unit 1, the draining step portions 31*r* provided adjacent to both ends of each of the protruding ribs 31*m* can drain the water as indicated by the arrows in FIG. 7. As a result, the draining step portions 31*r* can prevent water from moving toward the connectors 4 (that is, the side closer to the center in the short-side direction) along the ends of the vertical-direction lower surface 311. The electronic component unit 1 can thus more reliably prevent adhesion of water to the connectors 4.

The configuration of the electronic component unit according to the embodiment of the present invention described above is not limited to that in the embodiment above, and various changes and modifications can be made without departing from the spirit of the invention.

While the electronic component unit 1 has been explained as an electronic component module detachably attached to the electrical connection box 100, the embodiment is not limited thereto. The configuration of the electronic component unit according to the present embodiment may be applied to the electrical connection box 100 itself or another electronic component unit, for example.

While the electronic components 22 have been explained as relays, the embodiment is not limited thereto. The electronic components 22 may be fuses or control integrated circuits (ICs), for example.

The electronic component unit 1 does not necessarily include the inclined surfaces 31*p*, the draining portion 31*q*, or the draining step portions 31*r*, for example.

In the description above, the housing 3 includes the base cover 31 (base portion) and the top cover 32 (*lid*) and includes the insert bus bar plate 2 attached to the inside thereof. The embodiment, however, is not limited thereto. In the housing 3, the insert bus bar plate 2 may be attached to the top cover 32. Furthermore, the base cover 31 and the top cover 32 are not necessarily separated.

The electronic component unit 1 according to the present embodiment may be placed in a manner inclined at a predetermined angle with respect to the long-side direction. In this case, the electronic component unit 1 may be formed by changing the inclination direction of the inclined surfaces 31*p*, for example, depending on the assumed installation state of the electronic component unit 1. Also in this case, the inclined surfaces 31*p* in the electronic component unit 1 preferably incline such that the end on the long-side walls 31*c* and 32*c* side of the housing 3 is positioned lower in the vertical direction and that the end on the connector 4 side is positioned upper in the vertical direction when the housing 3 is placed at the installation position.

In the description above, the protruding ribs 31*m* are positioned between the connectors 4 and the respective long-side wall surfaces 31*c* of the housing 3 provided to the sides extending in the long-side direction of the vertical-direction lower surface 311, and extending from one end to the other end of the vertical-direction lower surface 311 along the long-side wall surfaces 31*c*. The embodiment, however, is not limited thereto. The protruding ribs may be positioned between the connectors 4 and the respective short-side wall surfaces 31*f* of the housing 3 provided to the sides extending in the short-side direction of the vertical-direction lower surface 311, and extending from one end to the other end of the vertical-direction lower surface 311 along the short-side wall surfaces 31*f*. The protruding ribs 31*m* and the protruding ribs described above may be combined.

The electronic component unit according to the present invention has the protruding ribs positioned between the respective side wall surfaces of the housing and the connecting units on the vertical-direction lower surface of the housing and extending from one end to the other end of the vertical-direction lower surface along the side wall surfaces. The protruding ribs can prevent water adhered to the side walls of the housing from moving toward the connecting units side along the vertical-direction lower surface. The electronic component unit can thus prevent adhesion of water to the connecting units.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electronic component unit comprising:
a housing configured to accommodate an electronic component therein and provided with a connecting unit disposed on a vertical-direction lowermost surface of the housing for connecting to an electric wire in a vertical connection direction, wherein
the housing has a protruding rib protruding downward in a vertical direction from the vertical-direction lowermost surface, positioned between the connecting unit and a side wall surface of the housing provided to a side of the vertical-direction lowermost surface, and extending from a first end to a second end of the vertical-direction lowermost surface along the side wall surface, wherein
the vertical-direction lowermost surface of the housing has a substantially rectangular shape with two substantially parallel short sides and two substantially parallel long sides, and wherein
the protruding rib extends along a direction parallel to the long sides of the vertical direction lowermost surface of the housing.

2. The electronic component unit according to claim 1, wherein
the housing has an inclined surface on the vertical-direction lowermost surface, the inclined surface inclining such that an end on a side wall surface side is positioned lower in the vertical direction than an end on a connecting unit side in a state where the housing is placed at an installation position, and
the protruding rib is provided in the inclined surface and extends in a direction intersecting with an inclination direction of the inclined surface.

3. The electronic component unit according to claim 2, wherein
the housing has a draining step portion positioned adjacent to the connecting unit side at both ends of the protruding rib on the vertical-direction lowermost surface and recessed upward in the vertical direction with respect to a vertical-direction lower end of the protruding rib.

4. The electronic component unit according to claim 1, wherein the housing has a draining step portion positioned adjacent to a connecting unit side at both ends of the protruding rib on the vertical-direction lowermost surface and recessed upward in the vertical direction with respect to a vertical-direction lower end of the protruding rib.

5. An electronic component unit comprising:

a housing configured to accommodate an electronic component therein and provided with a connecting unit disposed on a vertical-direction lowermost surface of the housing for connecting to an electric wire in a vertical connection direction, wherein the housing has a protruding rib protruding downward in a vertical direction from the vertical-direction lowermost surface, positioned between the connecting unit and a side wall surface of the housing provided to a side of the vertical-direction lowermost surface, and extending from a first terminal end to a second terminal end of the vertical-direction lowermost surface along the side wall surface, wherein the vertical-direction lowermost surface of the housing has a substantially rectangular shape with two substantially parallel short sides and two substantially parallel long sides, and wherein the protruding rib extends along a direction parallel to the long sides of the vertical direction lowermost surface of the housing.

* * * * *